United States Patent
Hong et al.

(10) Patent No.: US 9,488,773 B2
(45) Date of Patent: Nov. 8, 2016

(54) CIRCUIT BOARD AND FLAT PANEL DISPLAY INCLUDING THE SAME

(71) Applicant: LG INNOTEK CO., LTD., Seoul (KR)

(72) Inventors: Seung Kwon Hong, Seoul (KR); Hyun Gyu Park, Seoul (KR); In Hee Cho, Seoul (KR); Nam Yang Lee, Seoul (KR); Hyuk Soo Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 84 days.

(21) Appl. No.: 14/156,117

(22) Filed: Jan. 15, 2014

(65) Prior Publication Data

US 2014/0198530 A1    Jul. 17, 2014

(30) Foreign Application Priority Data

Jan. 15, 2013 (KR) ................. 10-2013-0004480

(51) Int. Cl.
| | |
|---|---|
| *B60Q 1/26* | (2006.01) |
| *F21V 8/00* | (2006.01) |
| *H05K 1/02* | (2006.01) |
| *H05K 1/05* | (2006.01) |

(52) U.S. Cl.
CPC ........... *G02B 6/0091* (2013.01); *G02B 6/0083* (2013.01); *H05K 1/0284* (2013.01); *G02B 6/0073* (2013.01); *H05K 1/056* (2013.01); *H05K 2201/09063* (2013.01); *H05K 2201/10106* (2013.01); *H05K 2201/2036* (2013.01)

(58) Field of Classification Search
CPC .................... F21Y 2101/02; G02B 6/0073
USPC .............................................. 362/232
See application file for complete search history.

(56) References Cited

U.S. PATENT DOCUMENTS

| | | | |
|---|---|---|---|
| 7,980,714 B2* | 7/2011 | Itaya ........................ 362/97.1 |
| 2007/0279944 A1* | 12/2007 | Sakai ......................... 362/633 |
| 2009/0116262 A1 | 5/2009 | Park |
| 2009/0256987 A1 | 10/2009 | Jeon et al. |
| 2009/0268124 A1* | 10/2009 | Kujiraoka et al. ............ 349/61 |
| 2012/0062816 A1* | 3/2012 | Tsubaki ........................ 349/61 |
| 2012/0069556 A1 | 3/2012 | Bertram et al. |
| 2012/0249886 A1 | 10/2012 | Kuromizu |
| 2013/0002985 A1* | 1/2013 | Hosoki ......................... 349/65 |

FOREIGN PATENT DOCUMENTS

KR    10-2012-0030845 A    3/2012

OTHER PUBLICATIONS

European Search Report dated Apr. 9, 2014 in European Application No. 14151280.6.

* cited by examiner

*Primary Examiner* — Evan Dzierzynski
(74) *Attorney, Agent, or Firm* — Saliwanchik, Lloyd & Eisenschenk

(57) ABSTRACT

Provided are a circuit board for irradiating light to a light guide plate and a flat panel display having a structure for efficiently fixing the circuit board and the light guide plate, the circuit board, including: a support substrate comprising a first area and a second area, the second area being bent from the first area; a plurality of light emitting device mounting parts disposed in the first area; and a protective member connecting part of an outer side of the plurality of light emitting device mounting parts.

15 Claims, 19 Drawing Sheets

CIRCUIT BOARD AND FLAT PANEL DISPLAY INCLUDING THE SAME

CROSS-REFERENCE TO RELATED APPLICATION

This application claims the benefit under 35 U.S.C. §119 of Korean Patent Application No. 10-2013-0004480, filed Jan. 15, 2013, which is hereby incorporated by reference in its entirety.

BACKGROUND OF THE INVENTION

1. Field of the Invention

The present invention relates to a circuit board for irradiating light to a light guide plate and a flat panel display having a structure capable of efficiently fixing the circuit board and the light guide plate.

2. Description of the Related Arts

Since a liquid crystal display (LCD) has no self-luminous property of emitting light itself, it needs backlight. A backlight unit (BLU), which performs a role as a light source of the LCD, is constituted of a complex constituting a light source for irradiating light to a rear surface of a liquid crystal module and a power circuit for the driving of the light source and all its appurtenances capable of enabling uniform flat light to be formed. Recently, the backlight unit using a light emitting diode (LED) has received attention as a backlight unit of the LCD.

The LED is a light emitting device which generates light using a light emitting phenomenon generated at the time of applying a voltage to a semiconductor. It is advantageous in that the LED has a small size compared to a conventional light source, a long life-span and a low operating voltage along with high energy efficiency because it converts electrical energy into light energy directly.

The LED is also used in a liquid crystal display, and the liquid crystal display (LCD) is drawing attention as a display device such as a monitor, a mobile communication terminal and the like. As the liquid crystal display becomes gradually thinner and miniaturization, the backlight unit has been also required to be reduced in width and size.

In order to realize the slimness and miniaturization of the backlight unit, when the LED and the light guide plate are disposed to be close to each other, it is problematic in that the LED is damaged upon thermal expansion of the light guide plate. Accordingly, there is a need to draw up efficient plan for preventing the LED from being damaged due to the light guide plate while having no bad influence on the slimness and miniaturization of the backlight unit.

SUMMARY OF THE INVENTION

An aspect of embodiments of the present invention may provide a circuit board in which a protective member is disposed at a position corresponding to a spaced part between light emitting devices mounted on a support substrate, thereby enabling the light emitting devices to be protected from a thermally expanding light guide plate thanks to the protective member.

Another aspect of embodiments of the present invention may provide a circuit board in which a protective member is configured to include a first support part extending in a thickness direction of a light guide plate or in a first direction with regard to the central portion of a spaced part between neighboring light emitting devices, and a second support part extending in a second direction which crosses the first direction from the first support part in between a support substrate and the light guide plate, thereby enabling the light emitting devices to be protected from the thermally expanding light guide plate using the protective member having various shapes.

A further aspect of embodiments of the present invention may provide a circuit board in which a coupling protrusion or a coupling hole connected to a protective member connecting part formed in a first area or a second area of a support substrate is provided in a protective member so that the protective member can be easily fixed to a regular position of the support substrate.

Yet another aspect of embodiments of the present invention may also provide a circuit board in which a protective member is disposed on a support substrate to protrude more than a thickness of a light emitting device so that the light emitting device can be prevented from being damaged due to a light guide plate, and may provide a flat panel display including the circuit board.

According to an aspect of embodiments of the present invention, a circuit board may include: a support substrate; a plurality of light emitting device mounting parts on the support substrate; and a protective member connecting part arranged at an outer side of the light emitting device mounting parts on the support substrate.

According to another aspect of embodiments of the present invention, a flat panel display may include a support substrate including a first area and a second area, the second area being bent from the first area; a plurality of light emitting device mounting parts on the first area of the support substrate; a lighting emitting device mounted to each of the plurality of light emitting device mounting parts; a protective member connecting part arranged at an outer side of the light emitting device mounting parts on the support substrate; a light guide plate spaced apart from the light emitting devices; a protective member between the support substrate and the light guide plate, and wherein a protruding length of the protective member from the support substrate to the light guide plate in the first area is greater than a protruding length of the light emitting device from the support substrate to the light guide plate.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF THE INVENTION

Figure 1A:
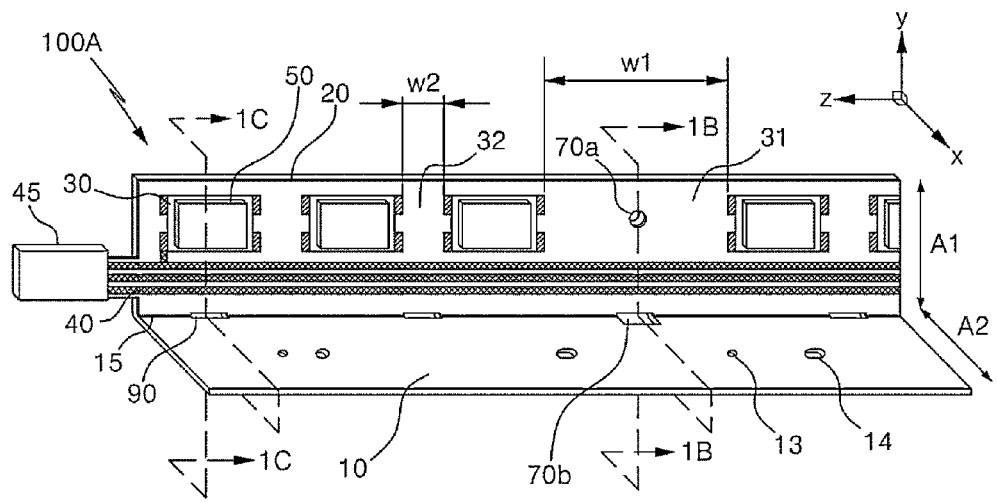
FIG. 1A is a perspective view of a circuit board according to one embodiment of the present invention.

Hereinafter, exemplary embodiments according to the present invention will now be described more fully hereinafter with reference to the accompanying drawings. In the explanation with reference to the accompanying drawings, regardless of reference numerals of the drawings, like numbers refer to like elements through the specification, and repeated explanation thereon is omitted. Terms such as a first term and a second term may be used for explaining various constitutive elements, but the constitutive elements should not be limited to these terms. These terms is used only for the purpose for distinguishing a constitutive element from other constitutive element.

Figure 1B:
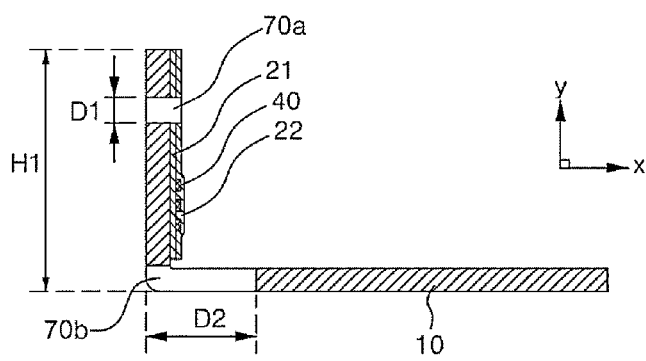
FIG. 1B is a cross-sectional view taken along line 1B-1B of the circuit board of FIG. 1A.
Figure 1C:
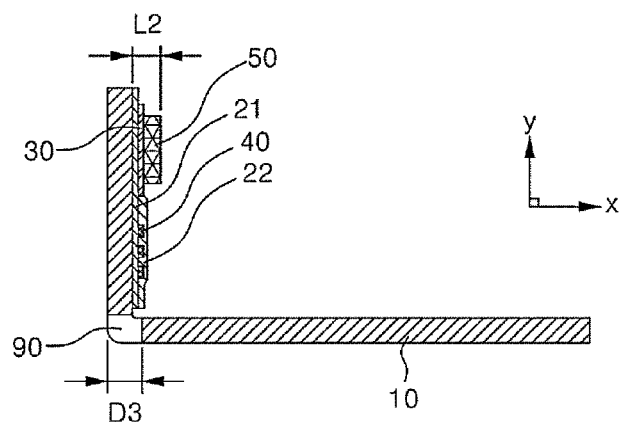
FIG. 1C is a cross-sectional view taken along line 1C-1C of the circuit board of FIG. 1A.

FIG. 1A is a perspective view of a circuit board according to one embodiment of the present invention, FIG. 1B is a cross-sectional view taken along line 1B-1B of the circuit board of FIG. 1A, and FIG. 1C is a cross-sectional view taken along line 1C-1C of the circuit board of FIG. 1A.

Referring to FIGS. 1A to 1C, a circuit board 100A according to the present embodiment may include: a support substrate 10; a plurality of light emitting device mounting parts 30; and a protective member connecting part 70a, 70b. Also, the circuit board 100A may include an insulating layer 20, a connecting wiring 40, a connector 45, and a light emitting device 50.

The support substrate 10 may be made of a material having stiffness and high thermal conductivity. The support substrate 10 supports the light emitting device 50 and a protective member (see reference numeral 60 of FIG. 3). For this, a material of the support substrate 10 may be aluminum (Al), stainless steel, copper or an alloy thereof. The support substrate 10 may have, for example, a shape in which a metal plate is bent, and may also have a thickness ranging from several millimeters to several centimeters.

The support substrate 10 may have a plurality of screw coupling holes 13 to be connected to a flat panel display, a sash frame of a lighting device and the like, or an aluminum housing. Also, the support substrate 10 may have a plurality of guide holes 14 for array of the plurality of screw coupling holes 13.

The support substrate 10 has a bending part 15 extending across approximately a center portion of the support substrate 10 in one direction (a z-axis direction). The bending part 15 is a part which is bent at roughly a right angle by pressing the center portion of the support substrate 10, and in order to prevent the support substrate from being bent after a bending process, a bending hole 90 may be provided in the bending part 15. The bending hole 90 may include a plurality of holes formed by removing a part of the support substrate 10 in an extension direction of the bending part 15.

According to the bending part 15 described above, the support substrate 10 may have a first area A1 having a predetermined length H1 in an y-axis direction and a second area A2 extending to be bent from the first area A1, and the first area A1 and the second area A2 may have a shape in which they are disposed at roughly a right angle. According to this structure, in a light guide plate (reference numeral 80 of FIG. 4) of a flat panel display or a lighting device, the first area A1 of the support substrate 10 may face a side of the light guide plate, and the second area A2 of the support substrate 10 may face any one of both surfaces surrounded by a side of the light guide plate.

The insulating layer 20 is configured to form a conductive pattern or wiring on the support substrate 10 and is formed on the support substrate 10. The insulating layer 20 may include a first insulating layer 21 on the support substrate 10, and a second insulating layer 22 configured to cover a part of the light emitting device mounting parts 30 on the first insulating layer 21 or the connecting wiring 40 in order to protect them. The first insulating layer 21 and the second insulating layer 22 may be made of the same insulating material without being limited thereto. For example, the first insulating layer 21 may be made of various kinds of insulating resin, and the second insulating layer 22 may be made of a photocurable material, such as photo solder resist (PSR), solder resist (SR) or flexible photo solder resist (FPSR).

The plurality of light emitting device mounting parts 30 are arranged on the support substrate in line in one direction (the z-axis direction). In this case, a first spaced part 31 in the first area A1 of the support substrate 10 and a second spaced part 32 having a smaller width w2 than a width w1 of the first spaced part 31 may be provided between the plurality of light emitting device mounting parts 30.

The connecting wiring 40 electrically connects the plurality of light emitting device mounting parts and the connector 45. The connecting wiring 40 may be implemented of a plurality of wirings depending on the number of plurality of light emitting mounting parts 30 or the number of predetermined light emitting groups. The connecting wiring 40 in the present embodiment is disposed in the first area A1.

The connector 45 is an interface for electrically connecting a driving circuit or a power supply of the outside and the circuit board 100A. The connector 45 may be disposed at an outer side of an end portion in one direction (the z-axis direction) of the support substrate 10 depending on a disposition position or a disposition structure of the circuit board 100A without being limited thereto.

The light emitting device 50 is arranged in the light emitting device mounting parts 30, respectively. The light emitting device 50 may be configured such that a power supply terminal thereof is connected to a pad wiring of the light emitting device mounting part 30 so as to receive a driving signal or a control signal of a voltage or current of a predetermined level through the connecting wiring 40 and the light emitting device mounting parts 30 and emit light in response to the driving signal or the control signal. The light emitting device 50 may be implemented of a light emitting diode (LED) and the like.

The protective member connecting part 70a, 70b is provided so that the protective member can be disposed at an outer side of the plurality of light emitting device mounting parts 30 of the support substrate 10. For example, the protective member connecting part 70a, 70b is provided so that the protective member can be stably disposed between the plurality of light emitting device mounting parts 30. To do so, the protective member connecting part may include a first protective member connecting part 70a disposed at the first spaced part 31 of the first area A1 and a second protective member connecting part 70b disposed at the second area A2.

Here, the first spaced part 31 is a specific part of the support substrate 10 exposed between two adjacent light emitting device mounting parts 30 and has a greater distance than that of the second spaced part 32 so that the first protective member connecting part 70a can be disposed, but the present invention is not limited thereto. For example, when the second spaced part 32 has an enough distance to dispose the protective member, the first protective member connecting part 70a may be also disposed at the second spaced part 32 except for the first spaced part 31.

The first protective member connecting part 70a may have a circular hole-like shape, but is not limited thereto. For example, the first protective member connecting part 70a may have a polygonal hole-like shape, a circular or polygonal hole-like shape, a circular or polygonal cutting part-like shape, a circular or polygonal protrusion-like shape, or a combined shape thereof (a partial groove and partial hole-like structure, a partial cutting part and partial protrusion-like shape, or the like).

When the first protective member connecting part 70a has a circular hole-like shape, a diameter thereof D1 may be about 1 to 5 mm without being limited thereto, and may be appropriately adjusted depending on a size of the support substrate 10 or a size of the protective member.

The second protective member connecting part 70b is provided to extend to the first area A1 via the bending part 15 from the second area A2. As illustrated in FIG. 1B, the second protective member connecting part 70b has a hole or opening-like shape passing though the support substrate 10 and also has a predetermined width D2 in an x-axis direction.

As illustrated in FIG. 1C, the width D2 of the second protective member connecting part 70b may be provided greater than a protruding length L2 of the light emitting device 50 protruding in the x-axis direction from the support substrate 10 in the first area A1. Also, the width D2 of the second protective member connecting part 70b may be provided greater than of a width D3 of the bending hole 90 in the x-axis direction. The width D3 of the bending hole does not extend beyond the protruding length L2 of the light emitting device 50 in the x-axis direction on the basis of the support substrate 10 of the first area A1.

According to the present embodiment, there may be provided the circuit board in which the protective member further protruding than the protruding length of the light emitting device 50 from the support substrate 10 of the first area A1 may be stably installed on the support substrate 10 through the first protective member connecting part 70a and the second protective member connection part 70b. For example, when a protective member having a specific shape is disposed using only the first protective member connecting part 70a, the protective member located at an edge of the light guide plate is rotated due to force in different directions applied at the time of thermal expansion of the light guide plate depending on an installation position of the first protective member connecting part 70a, so the surrounding light emitting devices may be damaged, whereas according to the protective member connecting parts 70a, 70b of the present embodiment, the protective member is stably supported not to be rotated by the first protective member connecting part 70a and the second protective member connecting part 70b, thereby preventing the surrounding light emitting devices from being damaged by rotation of the protective member.

Figure 2A:
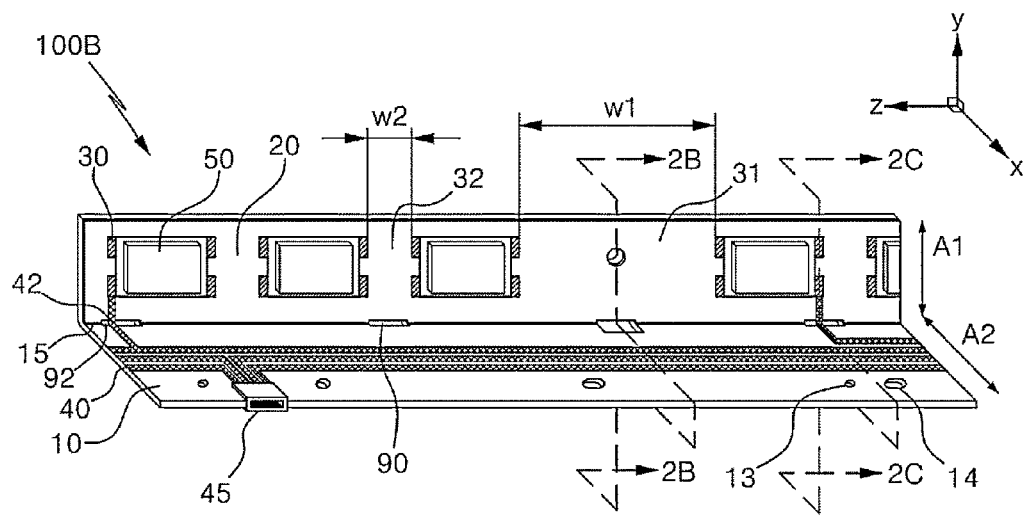
FIG. 2A is a perspective view of a circuit board according to another embodiment of the present invention.
Figure 2B:
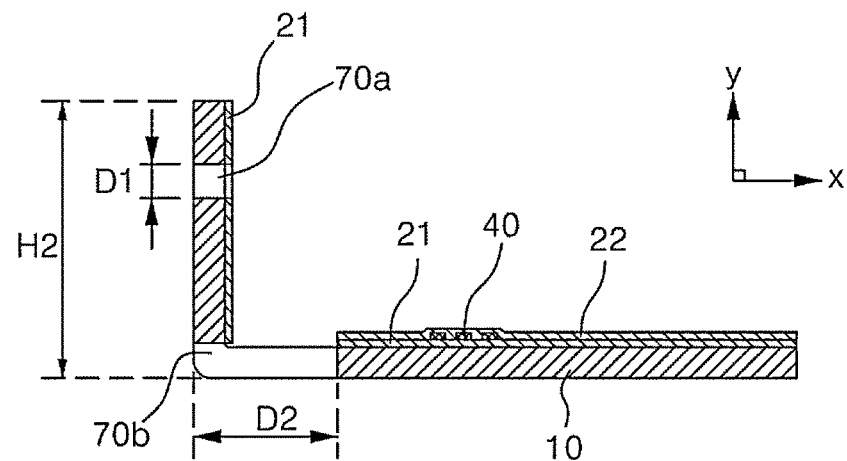
FIG. 2B is a cross-sectional view taken along line 2B-2B of the circuit board of FIG. 2A.
Figure 2C:
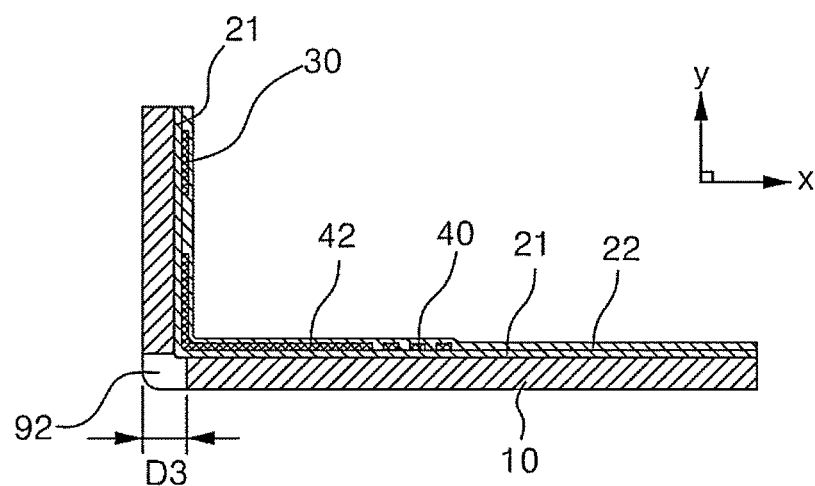
FIG. 2C is a cross-sectional view taken along line 2C-2C of the circuit board of FIG. 2A.

FIG. 2A is a perspective view of a circuit board according to another embodiment of the present invention, FIG. 2B is a cross-sectional view taken along line 2B-2B of the circuit board of FIG. 2A, and FIG. 2C is a cross-sectional view taken along line 2C-2C of the circuit board of FIG. 2A.

Referring to FIGS. 2A, 2B and 2C, a circuit board 100B according to the present embodiment may include the support substrate 10, the plurality of light emitting device mounting parts 30, and the protective member connecting parts 70a, 70b. Also, the circuit board 100B may include the insulating layer 20, the connecting wiring 40, the connector 45, and the light emitting device 50.

The circuit board 100B according to the present embodiment is substantially identical to the circuit board 100A described above with reference to FIGS. 1A, 1B and 1C except for the following facts: the connecting wiring 40 is mostly disposed in the second area A2; due to disposition of the connecting wiring 40 in the second area A2, a length H2 in the y-axis direction of the first area A1 becomes shorter compared to that shown in a case of FIG. 1B; the connecting wiring 42 connected to the light emitting device mounting parts 30 of the first area A1 extends to the second area A2 via a connecting wiring protection hole 92 in the first area A1; and the connector 45 has a shape in which the connector is inserted into a cutting part, in which a part of the support substrate 10 of the second area A2 is removed, in the x-axis direction. Accordingly, when explaining the circuit board according to the present embodiment, the detailed description on identical or similar constitutive elements will be omitted.

The connecting wiring protection hole 92 is intended to prevent the connecting wiring 42 from being damaged in the bending part 15 when the support substrate is bent after the connecting wiring 42 connected to the light emitting device mounting parts 30 of the first area A1 has been disposed to extend to the second area A2 via the connecting wiring protection hole 92 in the first area A1. The connecting wiring protection hole 92 may be substantially identical to the bending hole 90 except for the matter that the connecting wiring 42 goes through or passes through an upper portion of the connecting wiring protection hole.

Hereinafter, for the sake of convenience of illustration and explanations, illustration and explanations regarding the constitutive elements such as a coupling hole, a guide hole, and a second insulating layer of the support substrate, and the like will be omitted, and main technical features in each embodiment will be mainly described.

Figure 3:
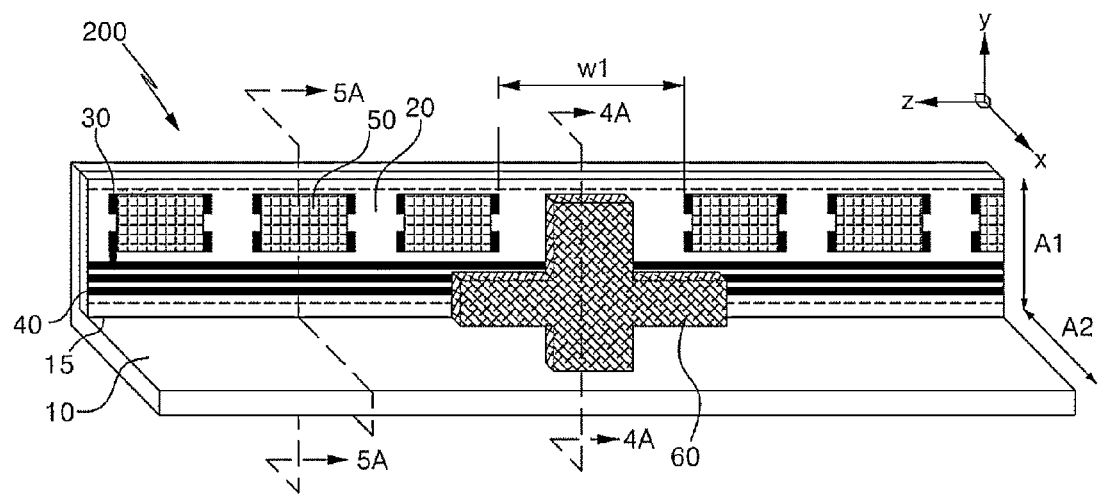
FIG. 3 is a perspective view of a circuit board according to a further embodiment of the present invention.

FIG. 3 is a perspective view of a circuit board according to a further embodiment of the present invention.

Referring to FIG. 3, a circuit board 200 may include the support substrate 10, the plurality of light emitting device mounting parts 30, and the protective member 60. The circuit board 200 may further include the insulating layer 20, the connecting wiring 40, and the light emitting device 50.

The support substrate 10 includes the first area A1, and the second area A2 extending to be bent from the first area A1.

The plurality of light emitting device mounting parts 30 are a plurality of pad parts for mounting the light emitting device and include a plurality of pad wirings provided in the first area A1. The light emitting device 50 is electrically connected to the pad wirings.

The connecting wiring 40 transmits an electrical signal of the outside to the light emitting device 50. The connecting wiring 40 may be disposed in the first area A1. The connecting wiring 40 refers to a conductive pattern for connecting the light emitting device 50 and a driving circuit part of the light emitting device 50. The driving circuit board may be implemented of a power circuit and a driving chip for driving the light emitting device 50 and the like.

The circuit board 200 includes a specific spaced part having a predetermined width w1 between the light emitting device 50 and the adjacent light emitting device 50. The light emitting device 50 is mounted on the pad wiring of the support substrate. In the present embodiment, the specific spaced part is at least one selected from among a plurality of spaced parts between the neighboring light emitting device mounting parts 30 or between the neighboring light emitting devices 50.

The protective member 60 is a stopper member configured to prevent the light guide plate toward the light emitting device 50 from expanding in between the support substrate 10 and the light guide plate in order to prevent the light emitting device 50 from being damaged by the light guide plate upon thermal expansion of the light guide plate, and is disposed at a position corresponding to the specific spaced part, namely, a position facing the specific spaced part.

In the aforesaid configuration, the insulating layer 20 is provided on one surface of the first area A1 of the support substrate 10. Also, the insulating layer 20 may be provided between the support substrate 10 and the light emitting device mounting parts 30, and between the support substrate 10 and the connecting wiring 40.

Figure 4:
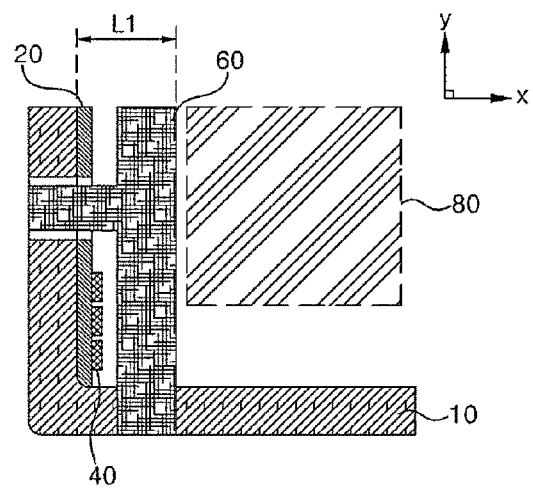
FIG. 4 is a cross-sectional view showing a flat panel display including the circuit board of FIG. 3.
Figure 5:
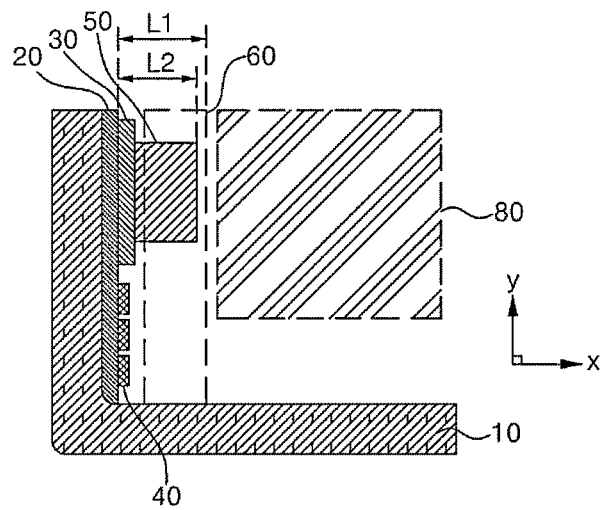
FIG. 5 is a cross-sectional view showing the other part of the flat panel display including the circuit board of FIG. 3.

FIG. 4 is a cross-sectional view corresponding to a cross section taken along line 4A-4A of a flat panel display including the circuit board of FIG. 3. FIG. 5 is a cross-sectional view corresponding to a cross section taken along line 5A-5A of a flat panel display including the circuit board of FIG. 3.

Referring to FIGS. 4 and 5, in the flat panel display including the circuit board of FIG. 3 and the light guide plate 80, the protective member 60 protrudes more than a thickness w of the light emitting device 50 in the support substrate of the first area A1 or has a protruding length L1 longer than a predetermined protruding length L2 in which the light emitting device 50 protrudes on one surface of the first area of the support board 10.

Thanks to this configuration, the protective member 60 prevents the light emitting device from being damaged by the light guide plate 80, thereby protecting the light emitting device 50. Also, a height of the protective member 60 formed to correspond to the first area A1 may be smaller than a height or length of the first area A1 in the y-axis direction.

As described above, in order to protect the light emitting device 50, the protective member 60 is disposed at a position corresponding to the spaced part having the predetermined width w1 between two adjacent light emitting devices. That is, in the circuit board 200 of FIG. 3, a part corresponding to a cross section resulting from cutting an area where the protective member 60 is present may be shown as FIG. 4.

According to the aforesaid embodiment, a shape of the protective member 60 may include a protruding structure having the first support part extending in a first direction (the y-axis direction) or all protruding structures having the first support part and the second support part extending in a second direction different from the first direction in the first support. For example, the cross section of the protective member 60 may have a single closed curve-like shape.

Figure 6:
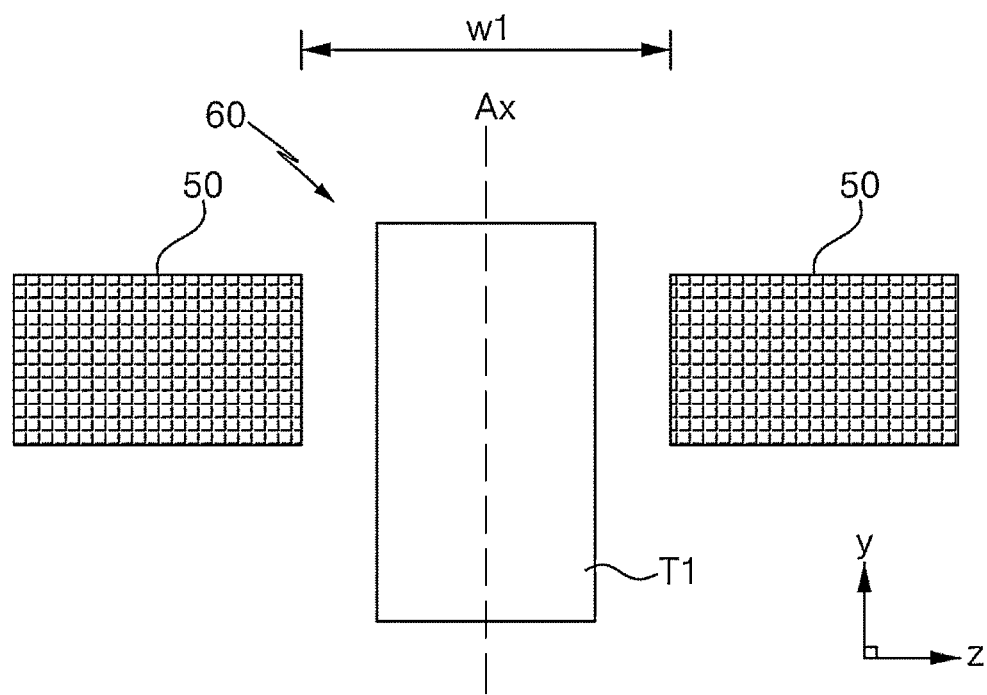
FIG. 6 is a schematic front view for explaining an arrangement relation of a protective member in the circuit board according to the one embodiment of the present invention.
Figure 7:
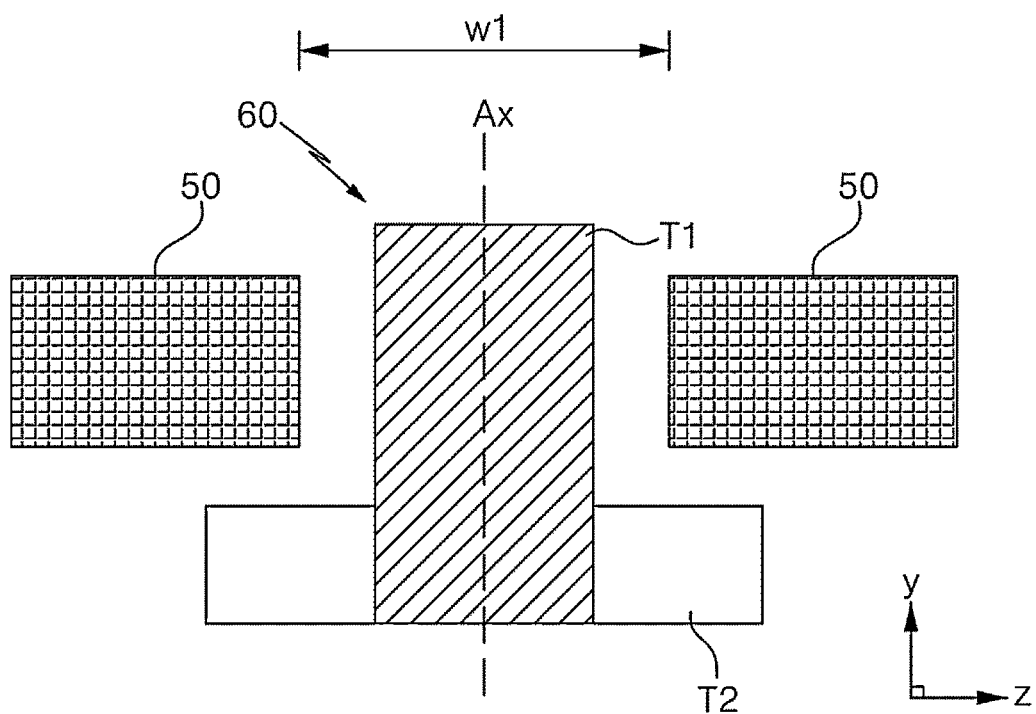
FIG. 7 is a front view showing a modified example of the protective member of FIG. 6.

FIG. 6 is a schematic front view for explaining an arrangement relation of the protective member in the circuit board according to the one embodiment of the present invention, and FIG. 7 is a front view showing a modified example of the protective member of FIG. 6.

Referring to FIG. 6, the protective member 60 includes the first support part T1 vertically formed in the second area of the support substrate in the extension direction of a central axis on the basis of the central axis Ax in a vertical direction (the y-axis direction) of the spaced part having the predetermined width w1. The first support part T1 may be defined as a support part area having a certain height, width or thickness along the central axis X in consideration of the imaginary central axis Ax of the spaced part in which the protective member 60 is disposed.

Referring to FIG. 7, the protective member 60 may protrude in a direction which crosses the extension direction (the y-axis direction) on the basis of the central axis Ax, and may further include at least one second support part T2 connected to the first support part T1. When the first support part T1 has a cross section that is regular such as a rectangular shape and is symmetric on the basis of the central axis Ax, the second support part T2 may include all support parts having shapes connected to the first support part T1 and extending in a direction (an x-axis direction) which lies at right angle to the extension direction of the central axis and/or in a slope direction (a direction which crosses the y-axis direction and the x-axis direction).

However, when the protective member 60 is embodied in various shapes, for example, when the protective member 60 has an asymmetrical structure on the basis of the central axis, the first support part T1 and the second support part T2 may be defined based on the following standards (see FIGS. 8 to 12).

FIGS. 8 to 12 are cross-sectional views of a protective member according to other embodiments of the present invention.

Figure 8:
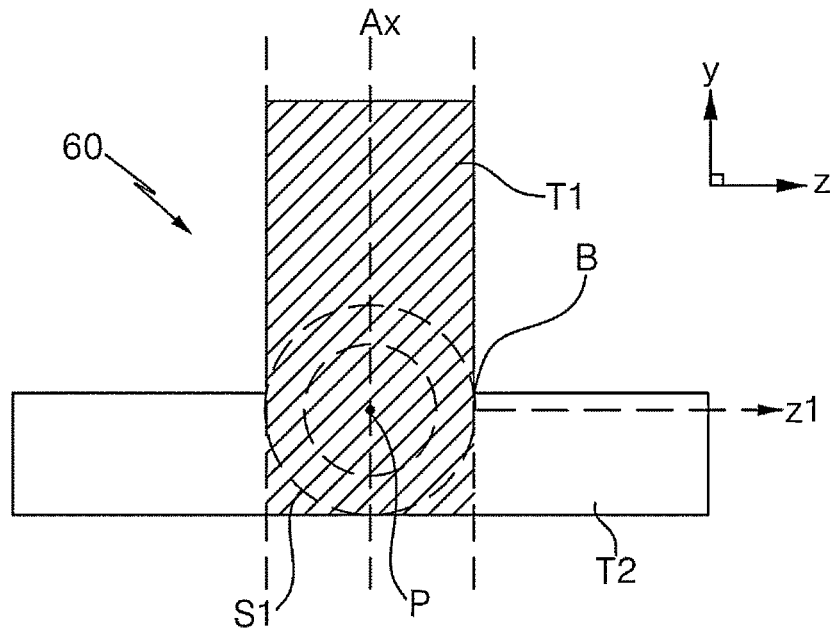
FIG. 8 through FIG. 12 are cross-sectional views of protective members according to other embodiments of the present invention.

Referring to FIG. 8, under consideration of a cross section of the protective member 60 in one direction, for example, a cross section by a plane (y-z plane) including a straight line being roughly parallel to one surface of the first area of the support member, an imaginary concentric circle may extend on the basis of an arbitrary point P fixed in the central axis Ax of the spaced part on which the protective member 60 is disposed. In this case, 'a standard concentric circle S1' reaches a point B which first meets with a surface of the protective member 60 in an inner portion of the extended concentric circle, and a part corresponding to the cross-sectional area of the vertical direction (the y-axis direction) corresponding to a width (diameter) of the standard concentric circle S1 is defined as the first support part T1. That is, in FIG. 8, a deviant cease lined-part corresponding to the vertical direction of the standard concentric circle S1 becomes as 'a standard area,' and the standard area is defined as the first support part T1. In this case, the protective member 60 has a "T"-shaped bending structure, and in the protective member 60, an entire area extending to a direction zl which crosses the vertical direction from the first support part may be defined as the second support part T2.

Figure 9:
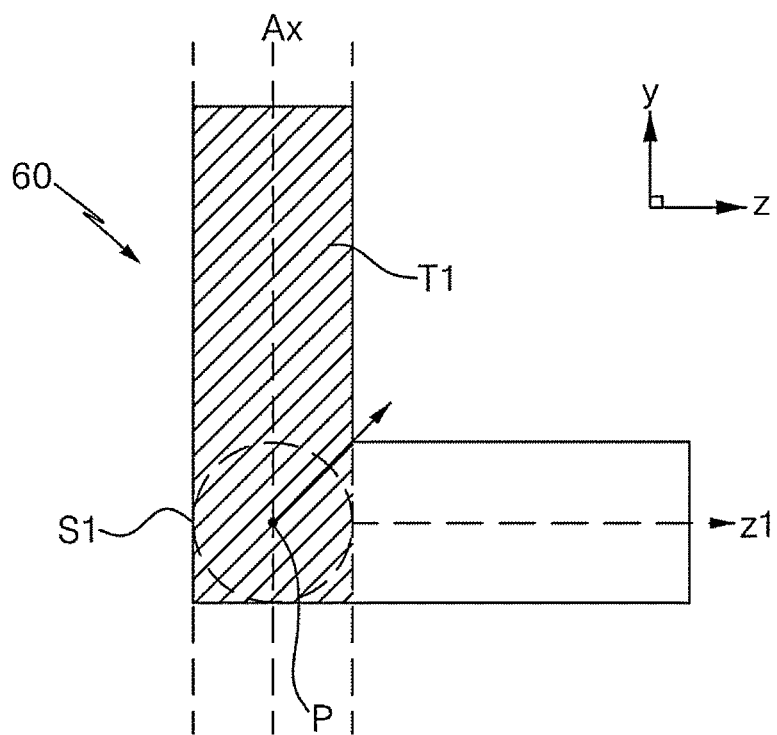

Referring to FIG. 9, when the protective member 60 has an "L"-shaped bending structure, the protective member 60 forms the standard concentric circle S1. The standard area on the basis of the standard concentric circle S1 may be defined as the first support part T1 and the remaining area may be defined as the second support part T2.

Figure 10:
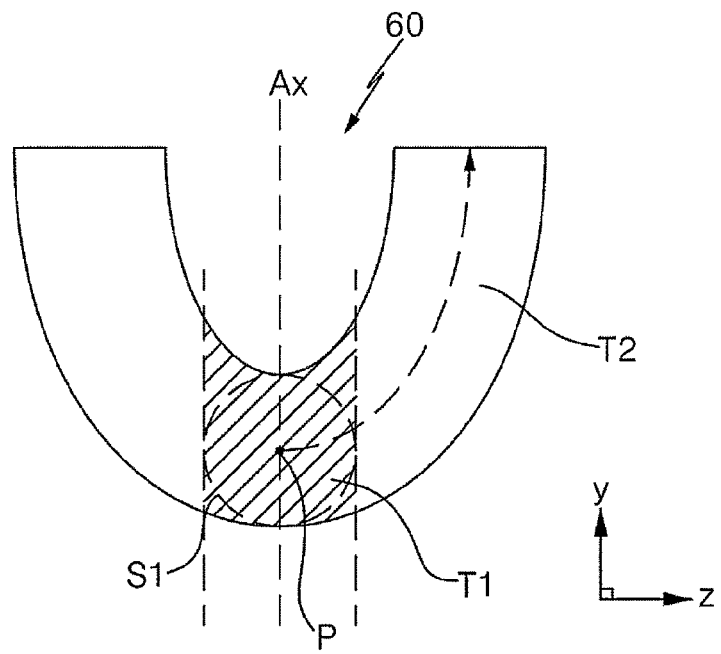
Figure 11:
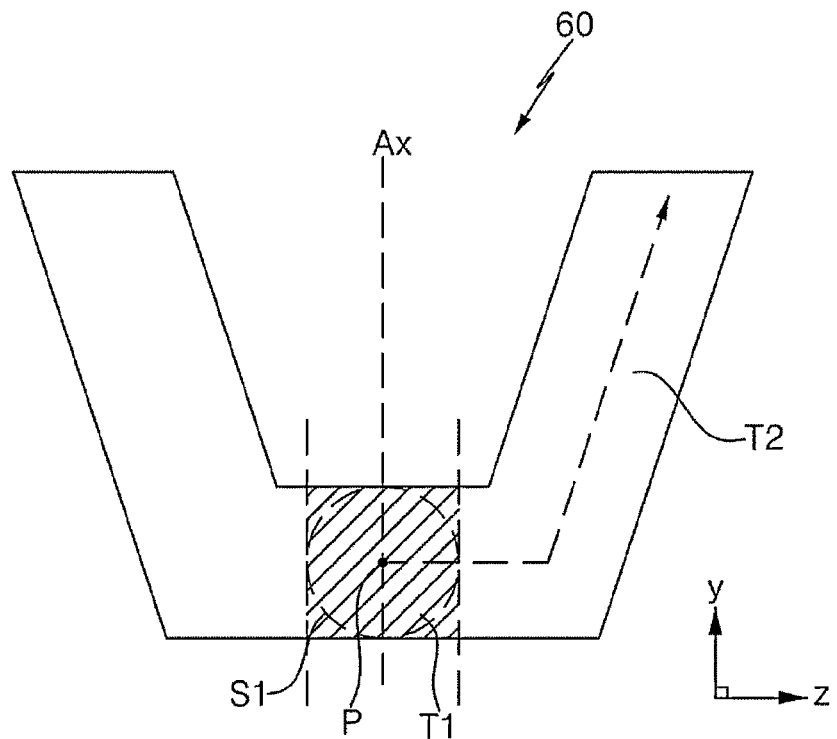

Referring to FIGS. 10 and 11, when the protective member 60 has a curve structure, U-like shape or V-like shape, the standard concentric circle A1 may be set at a central portion P of the protective member 60, the standard area in the vertical direction (the y-axis direction) resulting from the standard concentric circle S1 may be defined as the first support part T1, and an area extending in a direction which crosses the y-axis direction in the first support part T1 may be defined as the second support part T2.

Figure 12:
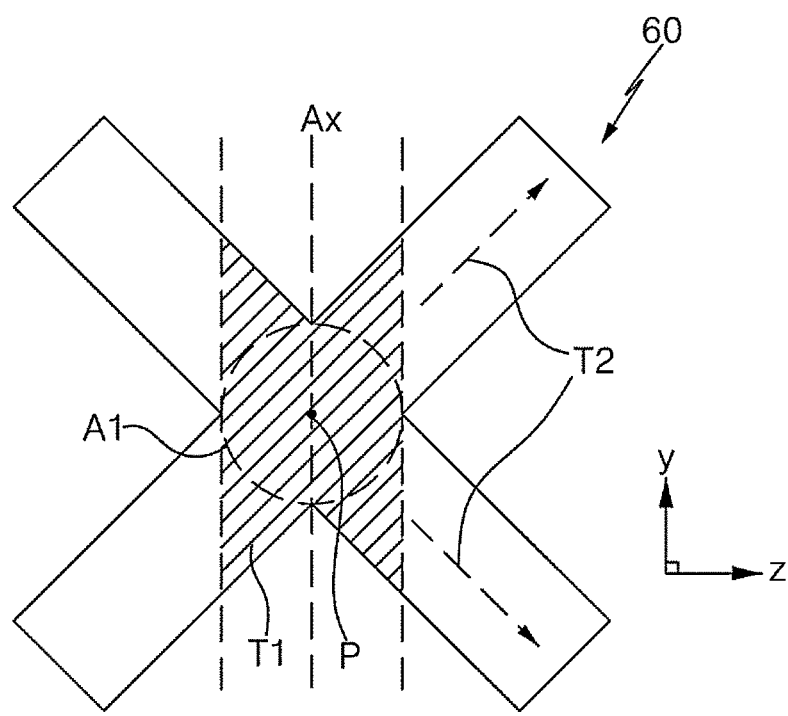

Referring to FIG. 12, when the protective member 60 has an X-like shape, based on the same principle described above, the standard concentric circle A1 may be set at the central portion P of the protective member, the standard area in a vertical direction resulting from the standard concentric circle A1 may be defined as the lateral support part T1 and the remaining area may be defined as the longitudinal support part T2.

According to further another embodiment, the protective member 60 may further include a fixing part connected to the protective member connecting part of the first area A1 or the second area A2 (see FIGS. 13 to 18).

Also, according yet another embodiment, the protective member 60 may include a binding part fixed to the first area A1 or the second area A2 of the support substrate 10 (see FIGS. 19 to 30). The binding part may be formed on a surface of the support substrate by a medium of an adhesive material. For example, when a first binding part is formed in the first area A1 of the support substrate 10, an adhesive material is applied to a surface of the first binding part being in contact with the first area A1 so that the first binding part can be easily fixed to the first area A1. Also, when a second binding part is formed in the second area A2 of the support substrate 10, an adhesive material is applied to a surface of the second binding part being in contact with the second area A2 so that the second binding part can be easily fixed to the second area A2. In order to increase binding strength, the protective member 60 may be provided in all the first area A1 and the second area A2 by a medium of the binding part.

Figure 13:
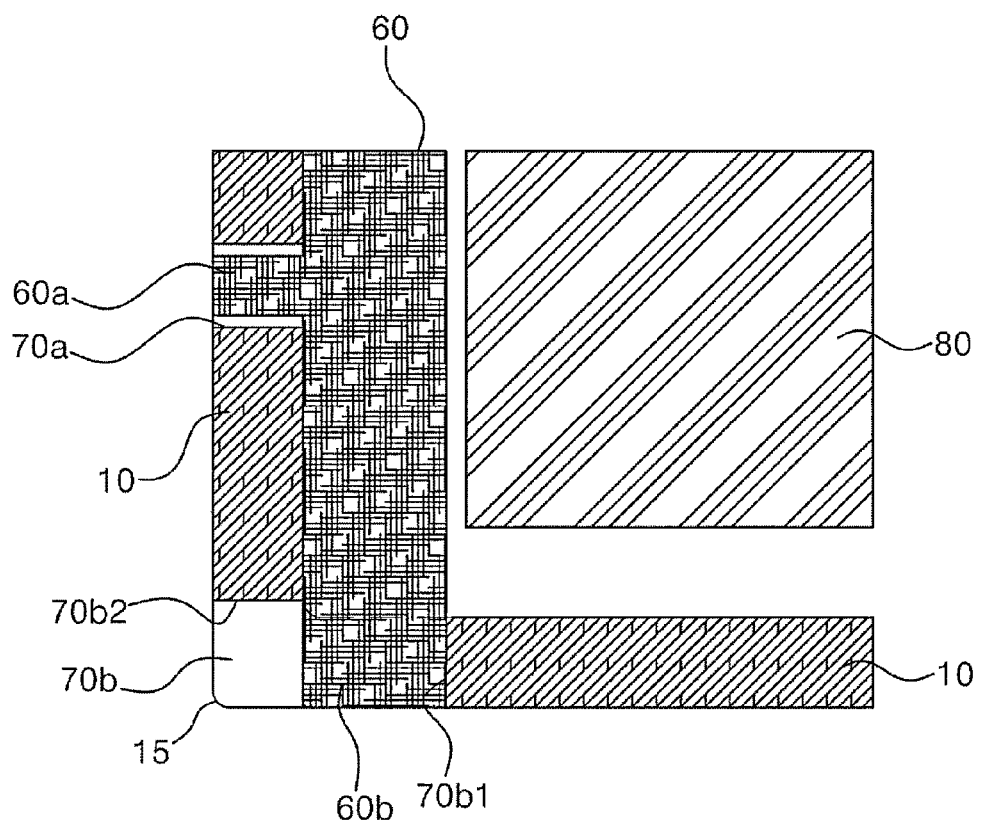
FIG. 13 is a schematic cross-sectional view of a flat panel display according to further another embodiment of the present invention.
Figure 14:
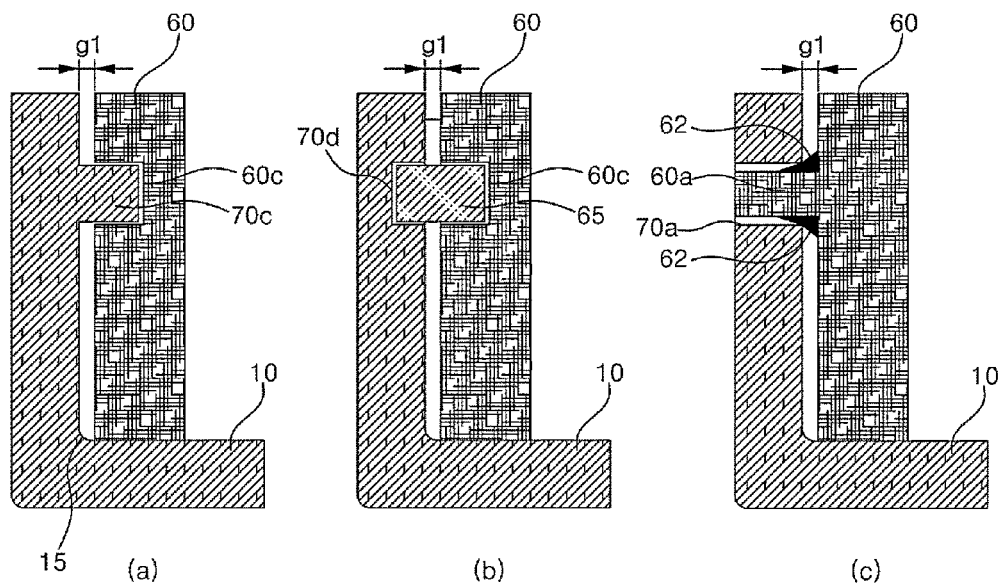
FIG. 14 is schematic cross-sectional views for explaining a protective member which can be adopted in the flat panel display of FIG. 13.

FIG. 13 is a schematic cross-sectional view of a flat panel display according to still another embodiment of the present invention. FIG. 14 is a schematic cross-sectional view for explaining other embodiments of a protective member which can be adopted in the flat panel display of FIG. 13.

Referring to FIG. 13, the flat panel display according to the present embodiment includes a support substrate 10, and an insulating layer on the support substrate, the light emitting device mounting parts on the insulating layer, and the light emitting devices on the light emitting device mounting part which are not shown in the drawing. The first protective member connecting part 70a is provided in the specific spaced part between the light emitting devices in the first area A of the support substrate 10. A first fixing part 60a provided in the protective member 60 is inserted into the first protective member connecting part 70a as a connection protrusion. Also, the second protective member connecting part 70b has an opening-like shape and extends to the first area A1 via the bending part 15 from the second area A2 of the support substrate 10. For example, on end of the second protective member connecting part 70b is located at the second area A2, another end of the second protective member connecting part 70b is located at the first area A1. A second fixing part 60b provided in the protective member 60 is a lower end of the first support part and is inserted into the second protective member connecting part 70b.

Thanks to this configuration, the flat panel display may stably support the protective member 60 at a desired position on the support substrate 10 so that the protective member 60 can further protrude than a protruding length of the light emitting device toward the light guide plate in the support substrate, thereby preventing the light emitting device from being damaged due to expansion of the light guide plate 80.

Also, the second protective member connecting part 70b is configured to extend to the first area A1 via the bending part from the second area A2, the protective member 60 can be closely attached to the first area of the support substrate 10. If another end of the second protective member connecting part 70b does not extend to the first area, it is difficult to closely attach the protective member 60 onto the support substrate 10 of the first area A1 due to the bending part 15 [see a gap g1 on (a) of FIG. 14]. Thanks to the configuration, the protective member 60 is supported by the first and second protective member connecting parts 70a, 70b and is disposed to be closely attached to the first area A1, thereby enabling the protective member 60 to be very reliably fixed on the support substrate 10.

Meanwhile, the aforesaid embodiment, when the protective member having the specific shape is used in a state of being coupled to the first protective member connecting part, in order to prevent the neighboring light emitting devices from being damaged by rotation of the protective member, the protective member is configured to include the first and second protective member connecting parts, but the present invention is not limited to the configuration. The protective member may be disposed to be closely attached to the second area with the first protective member connecting part of the first area, or the protective member may be disposed using only the second protective member connecting part.

Referring to (a) of FIG. 14, in a modified example of the protective member, which can be adopted in the flat panel display of FIG. 13, the protective member 60 may include a fixing part 60c having a hole or cutting part-like shape. Here, a protective member connecting part 70c having a protrusion-like shape connected to the fixing part 60c is provided in the first area A1 of the support substrate 10. A lower end of the first support part of the protective member 60 is closely attached to the support substrate in the second area.

Thanks to this configuration, the circuit board may stably support the protective member 60 at a desire position on the support substrate 10, thereby preventing the light emitting device from being damaged due to expansion of the light guide plate 80.

Also, referring to (b) of FIG. 14, in addition to the structure of the fixing part 60c of the protective member 60 shown in (a) of FIG. 14, the circuit board of the present embodiment may include a protective member connecting part 70d facing the fixing part 60c of the protective member 60 in the first area A1 of the support substrate 10. The protective member connecting part 70d may have a hole or cutting part-like shape. The fixing part 60c of the protective member 60 and the protective member connecting part 70d may have a hole or cutting part-like shape in a cylindrical or polygonal pillar-like shape, and may also have a connection member 65 in a cylindrical or polygonal pillar-like shape interposed therebetween to be engaged to each other.

In a circuit board or a flat panel display according to still another embodiment, as illustrated in (c) of FIG. 14, the fixing part 60a of the protective member 60 may include a hooked member 62 provided between the fixing part 60a and the first protective member connecting part 70a. The hooked member 62 may have a structure such as a hooked protrusion having a pin-like shape in a triangular form, a hooked protrusion having an internal washer-like shape and the like.

The hooked member 62 may be provided at a boundary part between a body of the protective member 60 and the first fixing part 60a. When the first fixing part 60a is inserted into the first protective member connecting part 70a formed in the first area A1 of the support substrate 10, the hooked member 62 may be inserted between an inner side of the first protective member connecting part 70a and the first fixing part 60a. For example, when the fixing part 60a of the protective member 60 is inserted into the first protective member connecting part 70a, a hooked protrusion may be inserted between the fixing part 60a and the first protective member connecting part 70a so that the fixing part 60a so that the fixing part 60a can be fully inserted into the first protective member connecting part 70a. Also, when the fixing part 60a and the first protective member connecting part 70a are connected to each other, one part of the hooked protrusion presses the periphery of the fixing part 60a in the inner side of the first protective member connecting part 70a, and the remaining other part of the hooked protrusion protrudes to the outside of the first protective member connecting part 70a.

Figure 15:
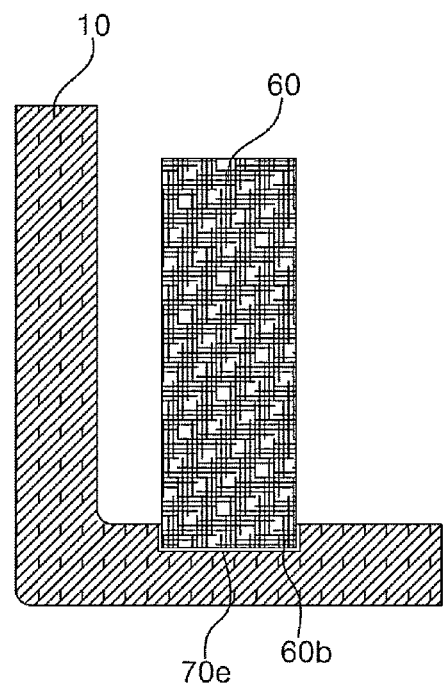
FIGS. 15 and 16 are schematic cross-sectional views for explaining a protective member which can be applied to the flat panel display of FIG. 13 according to yet another embodiments of the present invention.
Figure 16:
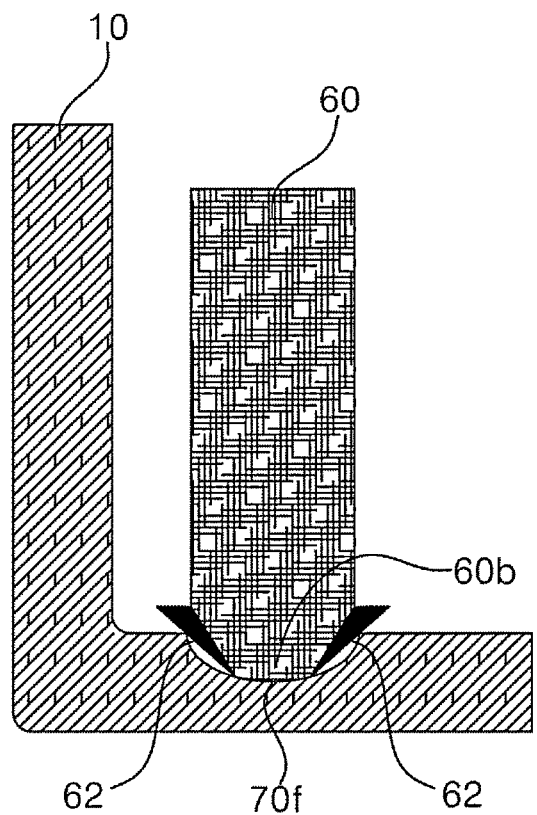

FIGS. 15 and 16 are schematic cross-sectional views for explaining a protective member which can be applied to the flat panel display of FIG. 13 according to yet other embodiments of the present invention.

Referring to FIG. 15, in another modified example of the protective member, which can be adopted in the flat panel display of FIG. 13, the circuit board or the flat panel display includes a protective member connecting part 70e provided in the second area A2. The protective member connecting part 70e has a hole or cutting part-like shape which does not pass through the support substrate 10. The protective member 60 includes the fixing part 60b inserted into the protective member connecting part 70e. The fixing part 60b may correspond to a lower end of the first support part of the protective member 60. Also, when the protective member 60 is inserted into the protective member connecting part 70e, an adhesive material may be applied therebetween so that they can be surely connected to each other. According to the present embodiment, the protective member 60 is inserted and fixed into the protective member connecting part 70e proved in the second area so that the protective member 60 can be stably disposed on the support substrate 10, thereby preventing the protective member 60 from being rotated on the support substrate 10.

Referring to FIG. 16, in the connection structure of the protective member which can be adopted in the flat panel display of FIG. 13, the hooked member 62 according to the present embodiment may be provided at an end edge of the second fixing part 60b provided in the protective member 60. That is, the hooked member 62 may be configured such that one part thereof is provided between the second fixing part 60b and a protective member connecting part 70f, and the other part thereof is provided to protrude to the outside of the protective member connecting part 70f. When the second fixing part 60b is inserted into the protective member connecting part 70f having a concave groove or cutting part-like shape provided in the second area A2 of the support substrate 10, the hooked member 62 may be partially inserted into the inside of the protective member connecting part 70f.

For example, the hooked member 62 is formed so that as the hooked member 62 gradually goes away from the end of the second fixing part 60b, a cross-sectional area of the hooked member 62 is increased, and thus one part of the hooked member 62, which is formed in a small size, is inserted into the protective member connecting part 70f with the second fixing part 60b, and the other part of the hooked member 62, which is largely formed, is exposed to the outside of the protective member connecting part 70f. In the aforesaid case, as if fixing umbrella ribs upon opening an umbrella, the hooked member 62 may function so that the protective member 60 can be more surely fixed to the support substrate 10.

In the aforesaid embodiments, the protective member 60 may be made of at one material of a metallic substance, a non-metallic inorganic substance, and a resin substance. For example, the metallic substance may be composed of at least one of gold, silver, copper, tin, lead, iron, aluminum, chromium, and mercury. The non-metallic inorganic substance may be composed of at least one of glass, ceramics, cement, and refractory. The resin material may be composed of at least one of polyethylene terephthalate (PET), polycarbonate (PC), polyether sulfone (PES), polyimide (PI), and polymethyl methacrylate (PMMA).

FIGS. 17 to 30 are views illustrating circuit boards according to still further other embodiments of the present invention and the flat panel displays including the circuit boards. Here, FIGS. 17, 19, 21, 23, 25, 27 and 29 are perspective views of the circuit boards according to the present embodiments of invention, and FIGS. 18, 20, 22, 24, 26, 28 and 30 are schematic cross-sectional views of the flat panel displays including the circuit boards of FIGS. 17 to 29, respectively, in order.

Figure 17:
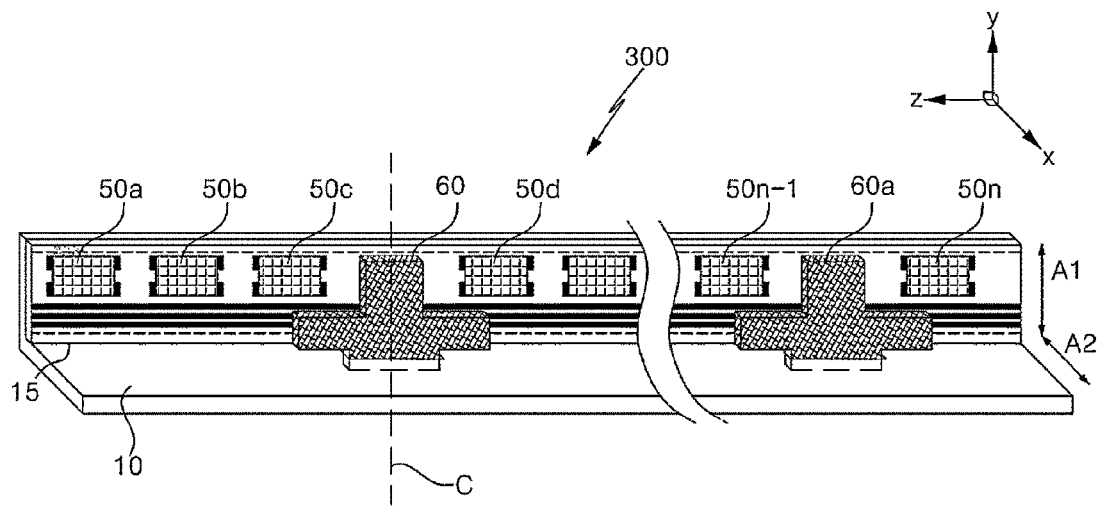
FIG. 17 is a perspective view of a circuit board according to still another embodiment of the present invention.

First, referring to FIG. 17, a circuit board 300 includes: the support substrate 10; a plurality of light emitting devices 50a, 50b, 50c, 50d, . . . 50n−1, and 50n; and a plurality of protective members 60, 60a. Here, n may be an optional natural number, which is greater than 6, for representing an $n^{th}$ light emitting device.

The protective members 60, 60*a* are provided on a specific spaced part between the two adjacent light emitting devices 50*c*, 50*d* on the circuit board 300. For example, the first protective member 60 may be located on the spaced part between the two adjacent light emitting devices 50*c*, 50*d*, and the second protective member 60*a* may be located on the spaced part between the two adjacent light emitting devices 50*n*–1, 50*n*. A distance of the specific spaced part may be equal to or greater than that of other spaced part.

Figure 18:
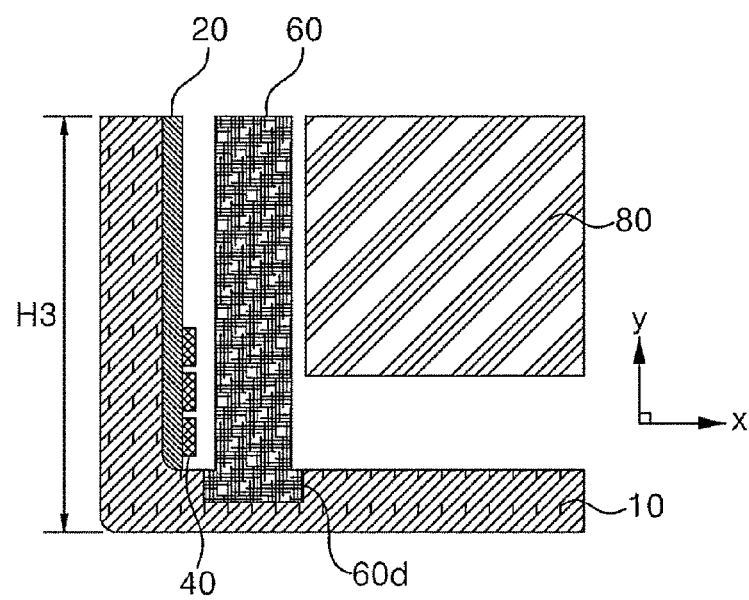
FIG. 18 is a schematic cross-sectional view of a flat panel display including the circuit board of FIG. 17.

The flat panel display including the aforesaid circuit board 300 includes, as illustrated in FIG. 18, the plurality of protective member 60, 60*a* having a thicker thickness than that of the light emitting devices on the support substrate 10 and provided between the support substrate 10 and the light guide plate 80. The first protective member 60 and the second protective member 60*a* may be formed in "a cross-like shape without being limited thereto, or may be provided in a Korean letter "ㅗ"-like shape or "T"-like shape as one part of the first support part is inserted into the circuit board 300. Also, a thickness or width of a first portion 60*d* of the first support part inserted into the second area of the support substrate 10 of the circuit board may be thicker than that of the remaining portion (a second portion) of the first support part. For reference, in FIG. 18, the light emitting devices are omitted.

Figure 19:
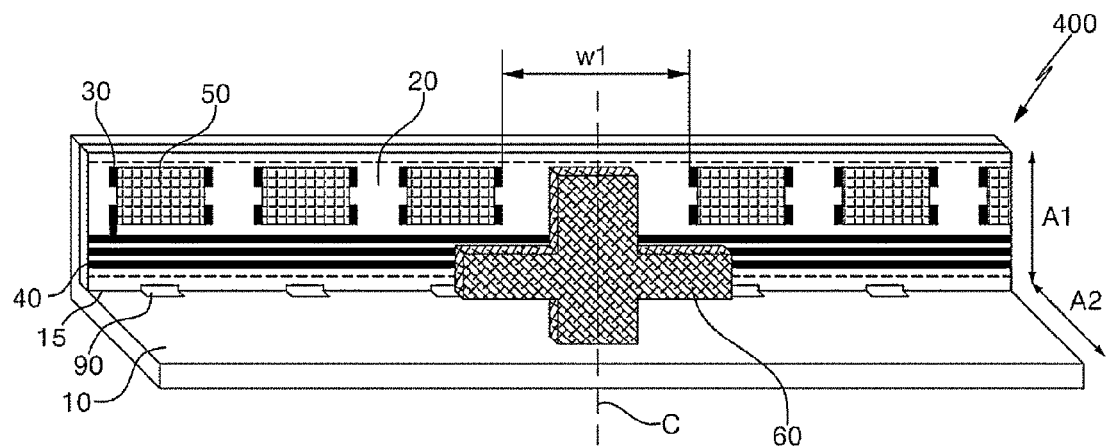
FIG. 19 is a perspective view of a circuit board according to still further another embodiment of the present invention.

Referring to FIG. 19, a circuit board 400 according to still further another embodiment includes: the support substrate 10; the insulating layer 20; the light emitting device mounting parts 30; the connecting wiring 40; the light emitting device 50; the protective member 60; and the bending hole 90. The support substrate 10 includes the first area A1 and the second area A2 extending to be bent from the first area A. The insulating layer 20 is formed on one surface of the first area A1 of the support substrate 10. The light emitting device mounting parts 30 include a pad wiring connected to the light emitting device 50. The connecting wiring 40 extends from a lower side of the light emitting device mounting parts 30 on the insulating layer 20 of the first area A1 and transmits an electrical signal to the light emitting device 50. The light emitting device 50 is mounted on the pad wiring of the insulating layer 20. The protective member 60 is disposed on the spaced part 50 having a predetermined width w1 between the adjacent light emitting devices 50. The bending hole 90 is intended to easily bend the support substrate 10 to the first area A1 and the second area A2, and is provided in the bending part 15 between the first area A1 and the second area A2. In the present embodiment, the circuit board 400 may further include a bonding layer (an adhesive material) provided between the second area A2 of the support substrate 10 and the protective member 60.

Figure 20:
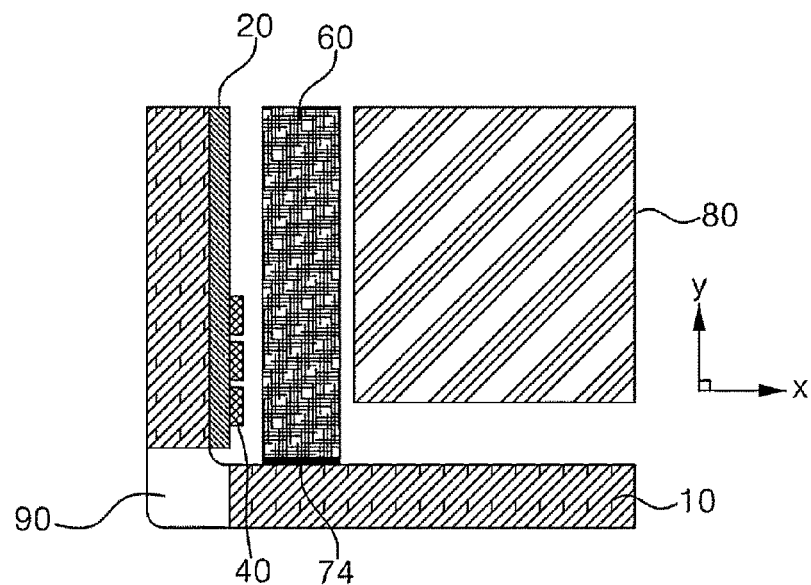
FIG. 20 is a schematic cross-sectional view of a flat panel display including the circuit board of FIG. 19.

FIG. 20 corresponds to a cross section resulting from cutting an area, where the protective member 60 of the circuit board 400 of FIG. 19 is present, along a predetermined segment C. Referring to FIG. 20, the flat panel display includes the circuit board and the light guide plate 80. The circuit board includes the support substrate 10, the protective member 60 and a bonding layer 74 between the support substrate 10 and the protective member 60.

According to the present embodiment, the protective member 60 having a predetermined shape may be easily installed on the support board 10 using the bonding layer 74, thereby preventing the light emitting device 50 from being damaged due to expansion of the light guide plate 80.

Figure 21:
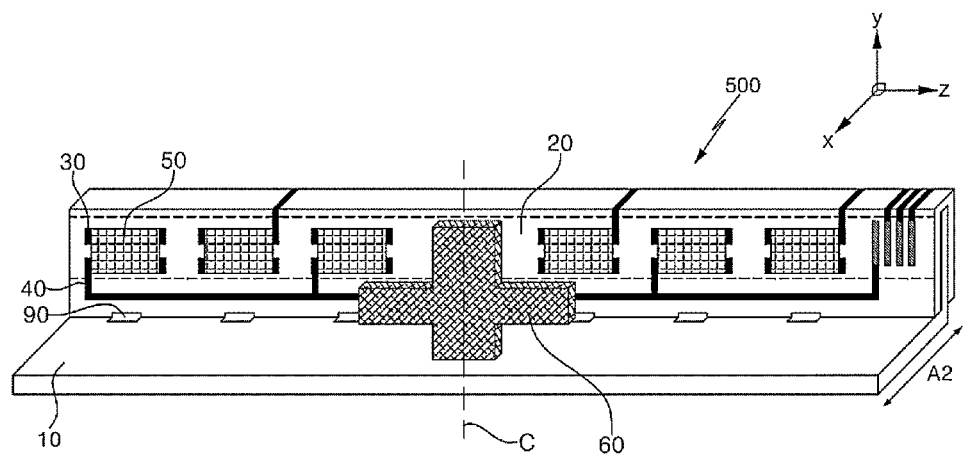
FIG. 21 is a perspective view of a circuit board according to still further another embodiment of the present invention.

Next, referring to FIG. 21, a circuit board 500 according to still further another embodiment includes the support substrate 10, the insulating layer 20, the light emitting device mounting parts 30, the connecting wiring 40, the light emitting devices 50, the protective member 60 and the bending hole 90. The support substrate 10 includes the first area A1 and the second area A2 extending to be bent from the first area A1. The insulating layer 20 is provided on a first surface where the first area A1 of the support substrate is located and on a second surface opposed to the first surface. The light emitting device mounting parts 30 includes the pad wiring connected to the light emitting device 50 mounted on one surface of the insulating layer 20. The connecting wiring 40 is provided on the first surface and the second surface of the insulating layer 20 to transmit an electrical signal to the light emitting device 50. Furthermore, the protective member 60 is disposed on the specific spaced part between the adjacent light emitting devices 50. In the present embodiment, the connecting wiring 40 may be provided at a side (upper side) where the first surface and the second surface of the insulating layer 20 meet.

Also, in the present embodiment, the circuit board 500 may further include a bonding layer (adhesive material) provided between the second area A of the support substrate 10 and the protective member 60.

Figure 22:
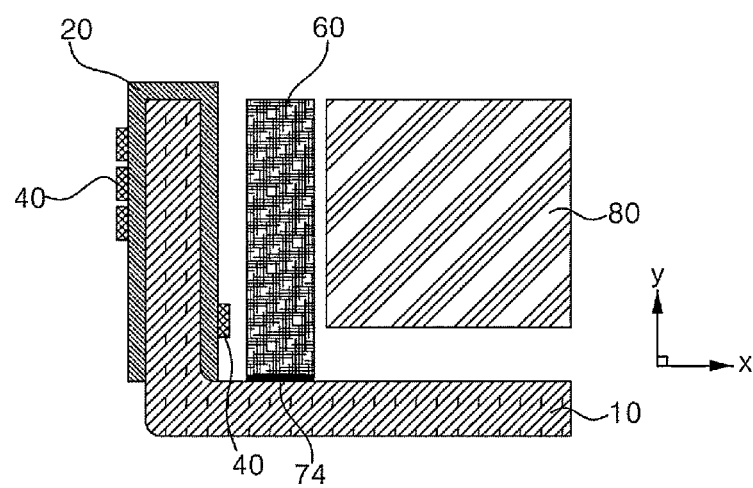
FIG. 22 is a schematic cross-sectional view of a flat panel display including the circuit board of FIG. 21.

Referring to FIG. 22, the flat panel display includes the circuit board and the light guide plate 80. The circuit board includes the support substrate 10, the protective member 60 and the bonding layer for connecting the support substrate 10 and the protective member 60. In FIG. 22, the light emitting device is omitted.

According to the present embodiment, the protective member 60 protrudes greater than a thickness of the light emitting device and is disposed at a position corresponding to the spaced part between the two adjacent light emitting devices. According to the present embodiment, the protective member 60 may prevent the light emitting device 50 from being damaged by the light guide plate 80.

Figure 23:
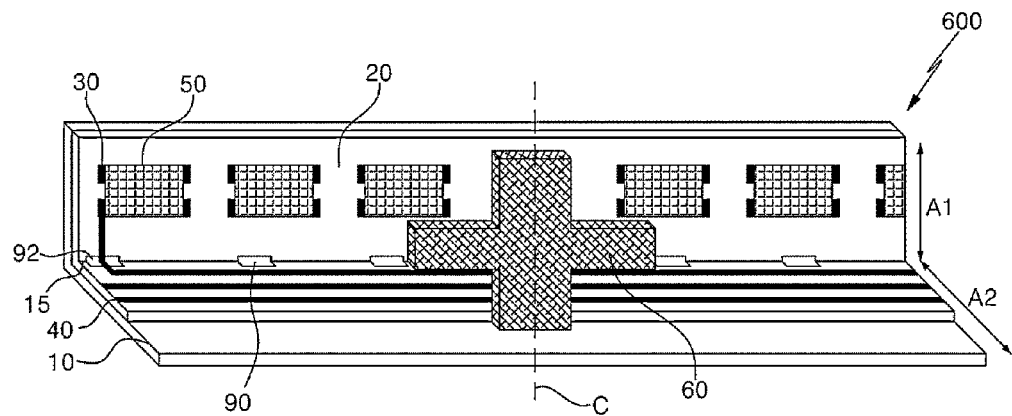
FIG. 23 is a perspective view of a circuit board according to still further another embodiment of the present invention.

Next, referring to FIG. 23, a circuit board 600 according to still further another embodiment may include: the support substrate 10 including the first area A and the second area B extending to be bent from the first area; the insulating layer 20 formed on the first surface of the first area A1 and on the first surface of the second area A2 of the support substrate 10; the light emitting device mounting parts 30 having the pad wiring connected to the light emitting device 50 on the first surface of the first area A1 of the insulating layer 20; the connecting wiring 40 located on the first surface of the second area A2 of the insulating layer 20 to transmit an electrical signal to the light emitting device; at least one protective member 60 disposed at a position corresponding to the spaced part between the adjacent light emitting devices 50; and the bending hole 90 formed in the bending part 15 between the first area A1 and the second area A2. In this case, the pad wiring and the connecting wiring 40 are electrically connected to each other, or the pad wiring and a power supply or driving circuit of the outside are electrically connected to each other.

Figure 24:
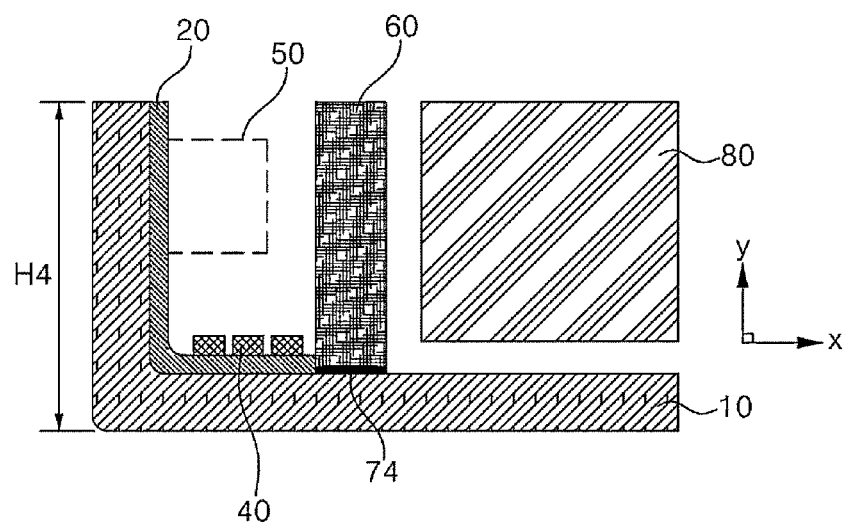
FIG. 24 is a schematic cross-sectional view of a flat panel display including the circuit board of FIG. 23.

FIG. 24 corresponds to a cross section resulting from cutting an area where the protective member 60 of the circuit board 600 is present. Referring to FIG. 24, the protective member 60 protrudes greater than a thickness of the light emitting device, and is disposed at a position corresponding to the spaced part between two adjacent light emitting devices. In the present embodiment, the connecting wiring 40 is disposed in the second area A2. Accordingly, a length and a height H2 as viewed in one direction (the y-axis direction) of the first area A1 may be reduced compared to those of a case in which the connecting wiring is disposed in the first area A1. According to the present embodiment, the protective member 60 may prevent the light emitting device 50 from being damaged by the light guide plate 80, and slimness of the flat panel display may be realized by reducing a height H4 of the first area A1.

Figure 25:
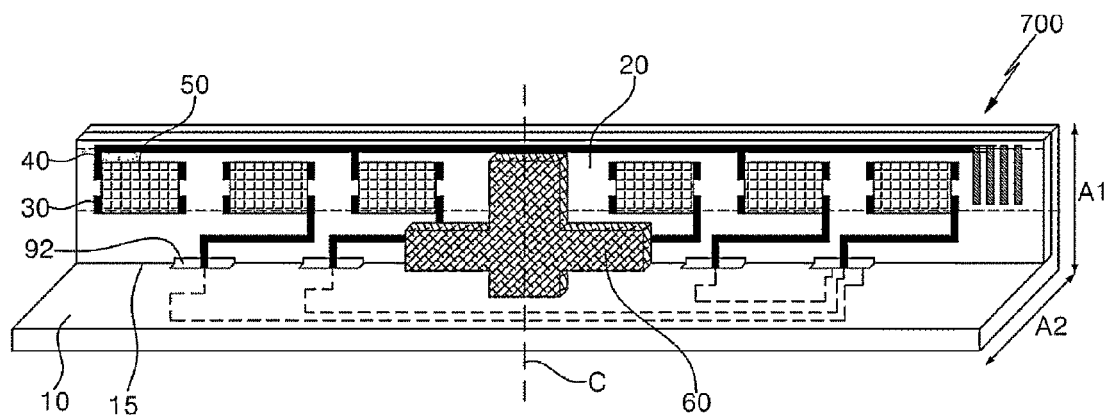
FIG. 25 is a perspective view of a circuit board according to still further another embodiment of the present invention.

Next, referring to FIG. 25, a circuit board 700 may include: the support substrate 10 including the first area A and the second area B extending to be bent from the first area; the insulating layer 20 formed on the first surface of the first area A1 of the support substrate 10 and on a fourth surface opposed to a third surface of the support substrate 10 where the second area A2 is located; the light emitting device mounting parts 30 in which the pad wiring connected to the light emitting device 50 mounted on the first surface of the first area A1 of the insulating layer 20 is formed; the connecting wiring 40 provided on the fourth surface of the second area of the insulating layer 20 to transmit an electrical signal to the light emitting device; at least one protective member 60 disposed at a position corresponding to the spaced part between the adjacent light emitting devices 50; and the connecting wiring protection hole 92 formed in the bending part 15 between the first area A1 and the second area A2. In this case, one part of the connecting wiring 40 extends from the first surface of the first area A1 of the support substrate 10 to the fourth surface of the second area A2 through the connecting wiring protection hole 92 so as to electrically connect the pad wiring and the connecting wiring 40.

Figure 26:
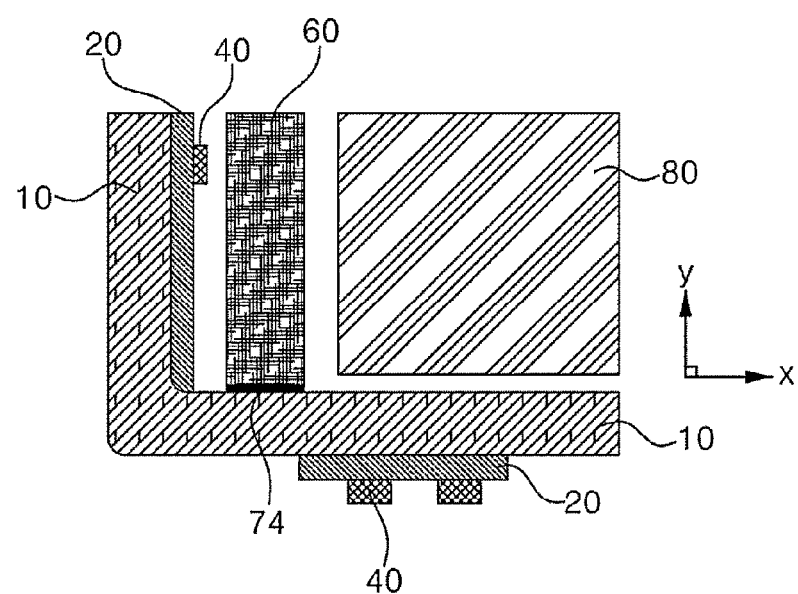
FIG. 26 is a schematic cross-sectional view of a flat panel display including the circuit board of FIG. 25.

FIG. 26 corresponds to a cross section resulting from cutting an area where the protective member 60 of the circuit board 700 of FIG. 25 is present, along the segment C. Referring to FIG. 26, the flat panel display includes the circuit board and the light guide plate 80. The protective member 60 of the circuit board is disposed at a position corresponding to the specific spaced part between two adjacent light emitting devices. The flat panel display further includes the bonding layer 74 disposed between the support substrate 10 of the circuit board and the protective member. For reference, in FIG. 26, the light emitting devices are omitted. According to the present embodiment, the protective member 60 may prevent the light emitting device 50 from being damaged by the light guide plate 80.

Figure 27:
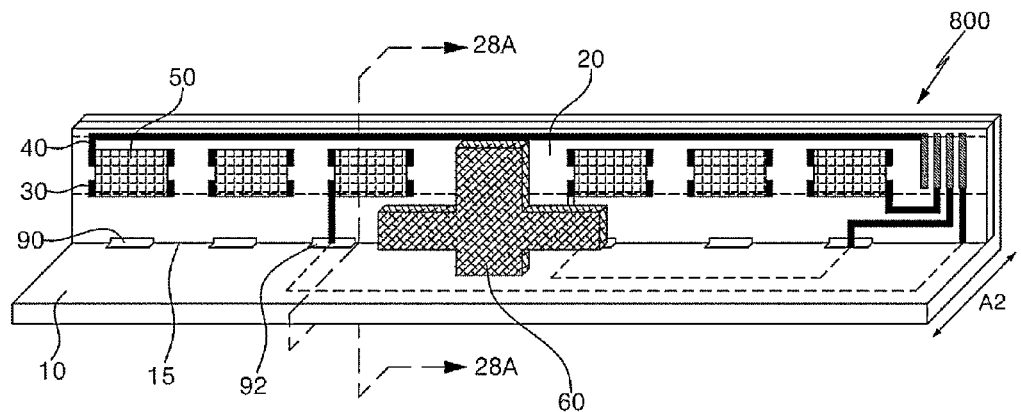
FIG. 27 is a perspective view of a circuit board according to still further another embodiment of the present invention.

Next, referring to FIG. 27, a circuit board 800 may include: the support substrate 10 including the first area A1 and the second area A2 extending to be bent from the first area; the insulating layer 20 formed on the first surface of the first area A1 of the support substrate 10, on the second surface opposed thereto, and on the fourth surface opposed to the third surface where the second area A2 is located; a through hole passing through the support substrate 10 and the first area A1 of the insulating layer 20 (see reference numeral 16 of FIG. 28); the light emitting device mounting parts 30 having the pad wiring disposed at one side of the through hole and connected to the light emitting device 50; the connecting wiring 40 disposed on the fourth surface of the second area A2 of the insulating layer 20 to transmit an electrical signal to the light emitting device 50; at least one protruding protective member 60 disposed at a position corresponding to the spaced part between the adjacent light emitting devices 50; and the bending hole 90 and the connecting wiring protection hole 92 formed between the first area A1 and the second area A2.

Figure 28:
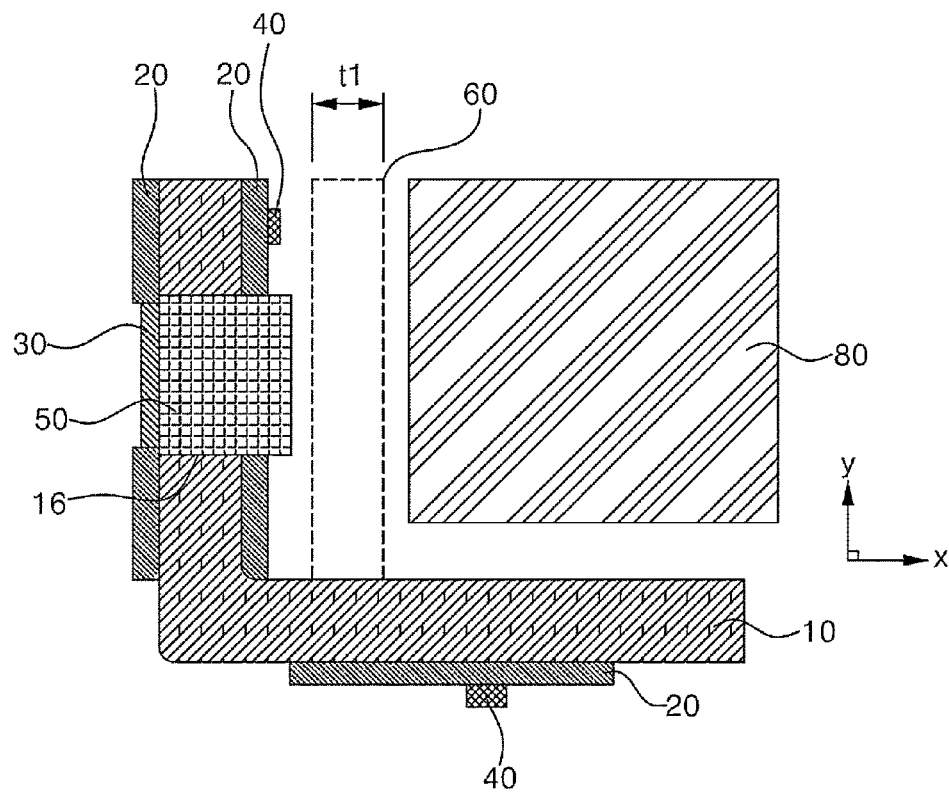
FIG. 28 is a schematic cross-sectional view of a flat panel display including the circuit board of FIG. 27.

As shown in FIG. 28, the light emitting device 50 is fully inserted into the through hole passing through the support substrate 10 and the first area A1 of the insulating layer 20. In this case, the protective member 60 may have a thinner thickness T1 than that of the protective member 60 illustrated in each of FIGS. 17 to 26. This is because the protective member 60 is formed to protrude greater than the thickness of the light emitting device 50 in order to protect the light emitting device 50, and the protective member 60 is provided only to such an extent as to form a separation space between the light guide plate 80 and the light emitting device 50 as the light emitting device 50 is fully inserted into the through hole. According to the present embodiment, the protective member 60 can prevent the light emitting device 50 from being damaged by the light guide plate 50.

Figure 29:
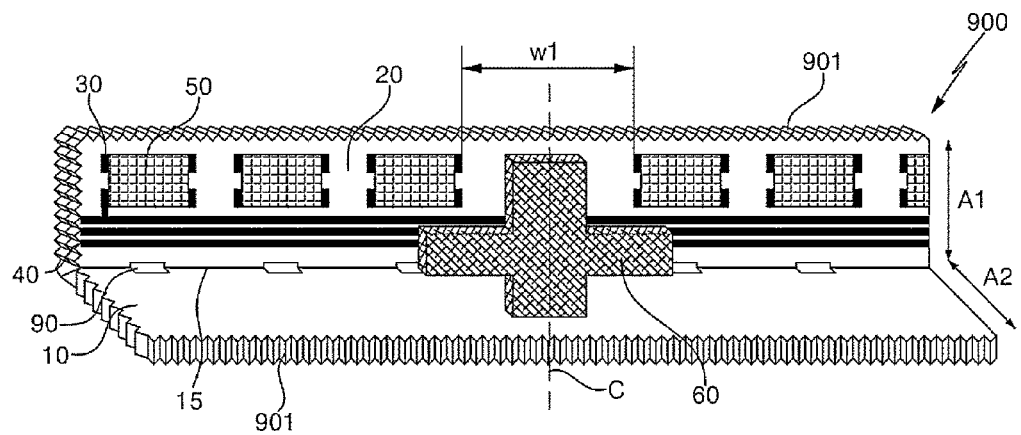
FIG. 29 is a perspective view of a circuit board according to still further another embodiment of the present invention.

Referring to FIG. 29, a circuit board 900 may include: the support substrate 10 including the first area A and the second area B extending to be bent from the first area; the insulating layer 20 formed on the first surface of the first area A1 of the support substrate 10; the light emitting device mounting parts 30 having the pad wiring connected to the light emitting device 50 mounted on the insulating layer 20; the connecting wiring 40 provided in a lower part of the light emitting device mounting parts 30 on the insulating layer 20 in one direction (the y-axis direction) to transmit an electrical signal to the light emitting device 50; the bending hole 90 formed in the bending part 15 between the first area A1 and the second area A2; and at least one protruding protective member 60 disposed at a position corresponding to the spaced part between the adjacent light emitting devices 50. At this time, the circuit board may include an edge pattern 901 at least one side of the support substrate 10. That is, the support substrate 10 may include the edge pattern 901 having a rugged shape provided on a side surrounding the first area A1 and the second area A2. The edge pattern 901 is intended to increase a surface area of the side of the support substrate 10. When it is assumed that there is a flat face having no edge pattern 901, the edge pattern 901 refers to a concave part which is concave from the flat face, a convex part which is convex from the flat face, or a rugged part having both the concave part and the convex part. In this case, the circuit board 900 may increase a radiating effect of the support substrate 10 by increasing a surface area of the support substrate 10.

Figure 30:
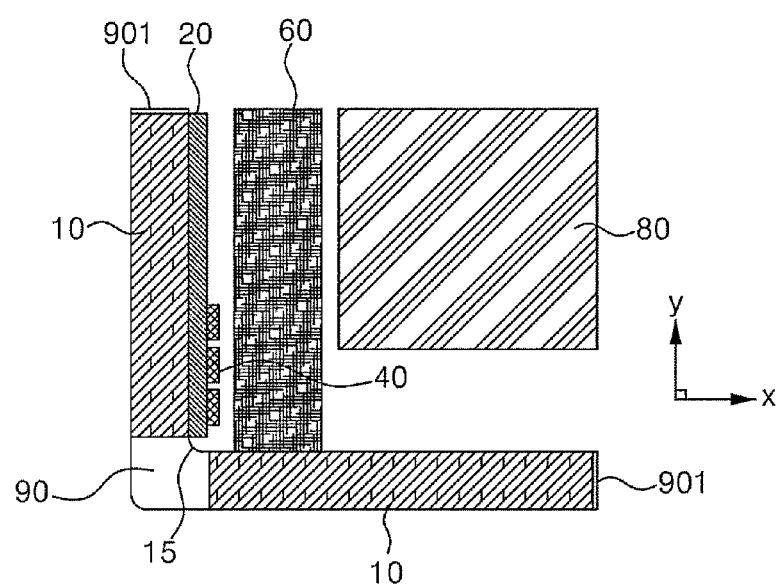
FIG. 30 is a schematic cross-sectional view of a flat panel display including the circuit board of FIG. 29.

FIG. 30 corresponds to a cross section resulting from cutting an area where the protective member 60 of the circuit board 900 of FIG. 29 is present, along the segment C. Referring to FIG. 30, the protective member 60 is formed to protrude greater than a thickness of the light emitting device, and is disposed at a position corresponding to the specific spaced part between two adjacent light emitting devices. According to the present embodiment, the protective member 60 may prevent the light emitting device 50 from being damaged by the light guide plate 80.

As set forth above, according to the embodiments of the present invention, the protective member is disposed at the position corresponding to the spaced part between the adjacent light emitting devices mounted on the support substrate so that the light emitting device can be protected from the thermally expanding light guide plate by the protective member.

According to the embodiments of the present invention, the protective member is configured to include the first support part extending in the thickness direction of the light guide plate or the first direction with regard to the center portion of the spaced part between the adjacent light emitting devices and the second support part extending in the second direction different from the first direction from the first support in between the support substrate and the light guide plate so that the light emitting device can be protected from the thermally expanding light guide plate using the protective member having various shapes.

According to the embodiments of the present invention, there may be provided the circuit board which is configured such that the protective member is provided with the coupling protrusion or the coupling hole connected to the protective member connecting part formed in the second area so as to be properly fixed to a regular position on the support substrate.

According to the embodiments of the present invention, there may be provided the circuit board, which is configured such that the protective member is formed to protrude greater than the thickness of the light emitting device so that the light emitting device can be prevented from being damaged by the light guide plate, and the flat panel display including the circuit board.

Meanwhile, the aforesaid embodiments are described based on the flat panel display including the circuit board, but the present invention is not limited to the flat panel display. The present invention may be implemented of a lighting device including the circuit board. In this case, the lighting device may include a car lighting device such as a headlight as well as general lighting devices such as lamp devices and the like.

As previously described, in the detailed description of the invention, having described the detailed exemplary embodiments of the invention, it should be apparent that modifications and variations can be made by persons skilled without deviating from the spirit or scope of the invention. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims and their equivalents.

What is claimed is:

1. A circuit board, comprising:
a support substrate;
a plurality of light emitting device mounting parts on the support substrate;
a protective member connecting part arranged between the light emitting device mounting parts on the support substrate; and
a bending part between a first area and a second area of the support substrate;
wherein the plurality of light emitting device mounting parts are located at the first area;
wherein the protective member connecting part has a hole-like shape, a protrusion-like shape, a cutting part-like shape, or a combined shape thereof on the support substrate or in the support substrate;
wherein the protective member connecting part comprises a second protective member connecting part of the second area, or both the second protective member connecting part of the second area and a first protective member connecting part of the first area; and
wherein the second protective member connecting part extends from a surface of the second area to a surface of the first area via the bending part.

2. The circuit board of claim 1, further comprising a protective member disposed on the support substrate to be connected to the first protective member connecting part, the second protective member connecting part or the first and second protective member connecting parts.

3. The circuit board of claim 2, wherein the protective member has a coupling protrusion or coupling hole connected to the protective member connecting part.

4. The circuit board of claim 2, further comprising a light emitting device mounted to the plurality of light emitting device mounting parts arranged in the first area, wherein a first protruding length of the protective member from the support substrate in the first area is greater than a second protruding length of the light emitting device from the support substrate in the first area.

5. The circuit board of claim 2, further comprising a first spaced part between adjacent light emitting device mounting parts and a second spaced part between other adjacent light emitting device mounting parts, and the protective member is disposed on the first spaced part having a greater distance than that of the second spaced part.

6. The circuit board of claim 2, wherein the protective member comprises a first support part extending in a first direction.

7. The circuit board of claim 6, wherein the protective member further comprises a second support part extending in a second direction different from the first direction from the first support part.

8. The circuit board of claim 7, wherein the protective member is provided in a cross-like shape, T-like shape, L-like shape, U-like shape, V-like shape or X-like shape.

9. The circuit board of claim 2, further comprising a hooked member connected between the protective member and the first protective member connecting part, between the protective member and the second protective member connecting part or between the protective member and each of the first and second protective member connecting parts.

10. The circuit board of claim 1, further comprising a connecting wiring protection hole provided in the bending part; and a connecting wiring extending to the second area via the connecting wiring protection hole from the first area.

11. The circuit board of claim 10, wherein the connecting wiring is disposed on at least one surface of a first surface of the support substrate where the first area is located, a second surface which is opposite to the first surface, a third surface of the support substrate where the second area is located, and a fourth surface which is opposite to the third surface.

12. The circuit board of claim 1, wherein the support substrate comprises an edge pattern having a rugged shape provided on a side surrounding the first area and the second area.

13. The circuit board of claim 1, further comprising a protective member disposed on the support substrate of an outer side of the light emitting device mounting parts; and a bonding layer between the protective member connecting part and the protective member, wherein the protective member is fixed onto the support substrate through the bonding layer.

14. A circuit board, comprising:
a support substrate;
a plurality of light emitting device mounting parts on the support substrate;
a protective member connecting part arranged at an outer side of the light emitting device mounting parts on the support substrate;
a bending part between a first area and a second area of the support substrate;
a protective member disposed on the support substrate to be connected to the first protective member connecting part, the second protective member connecting part, or the first and second protective member connecting parts; and
a light emitting device mounted to the plurality of light emitting device mounting parts arranged in the first area;
wherein the plurality of the light emitting device mounting parts are located at the first area of the support substrate;

wherein the protective member connecting part has a hole-like shape, a protrusion-like shape, a cutting part-like shape, or any combination of such shapes on the support substrate or in the support substrate;

wherein the protective member connecting part comprises a first protective member connecting part of the first area, a second protective member connecting part of the second area, or a combination thereof;

wherein a first protruding length of the protective member from the support substrate in the first area is greater than a second protruding length of the light emitting device from the support substrate in the first area; and wherein the light emitting device mounting parts are disposed on a second surface in which the support substrate is interposed and which is opposite to a first surface where the first area is located, and the light emitting device is mounted to the light emitting device mounting parts by passing through the support substrate in the first area.

15. A flat panel display, comprising:

a support substrate including a first area and a second area, the second area being bent from the first area;

a plurality of light emitting device mounting parts arranged at the first area of the support substrate;

a light emitting device mounted to the plurality of light emitting device mounting parts;

a protective member connecting part disposed between the light emitting device mounting parts on the support substrate;

a light guide plate spaced apart from the light emitting device; and a protective member between the support substrate and the light guide plate, wherein a protruding length of the protective member from the support substrate to the light guide plate in the first area is greater than a protruding length of the light emitting device from the support substrate to the light guide plate;

wherein the protective member connecting part has a hole-like shape, a protrusion-like shape, a cutting part-like shape, or a combined shaped thereof on the support substrate or in the support substrate;

wherein the protective member connecting part comprises a second protective member connecting part of the second area, or both the second protective member connecting part of the second area and a first protective member connecting part of the first area; and wherein the second protective member connecting part extends from a surface of the second area to a surface of the first area via the bending part.

* * * * *